United States Patent
Buondelmonte et al.

(10) Patent No.: US 6,790,056 B2
(45) Date of Patent: Sep. 14, 2004

(54) INTERCONNECTION PIN/SOCKET COMPONENTS FOR ELECTRICALLY CONNECTING TWO CIRCUIT BOARDS AND METHOD FOR MOUNTING SAID COMPONENTS IN A CIRCUIT BOARD

(75) Inventors: Charles J. Buondelmonte, Glen Gardner, NJ (US); Joseph P. Mendelsohn, Englishtown, NJ (US); Richard William Brown, Hilliard, OH (US); Min Li, Basking Ridge, NJ (US); Richard Franklin Schwartz, Cranbury, NJ (US); Sanjay S. Upasani, Manalapan, NJ (US)

(73) Assignee: Andrew Corporation, Orland Park, IL (US)

( * ) Notice: Subject to any disclaimer, the term of this patent is extended or adjusted under 35 U.S.C. 154(b) by 0 days.

(21) Appl. No.: 10/393,434

(22) Filed: Mar. 20, 2003

(65) Prior Publication Data

US 2003/0232522 A1 Dec. 18, 2003

Related U.S. Application Data

(60) Provisional application No. 60/365,824, filed on Mar. 20, 2002.

(51) Int. Cl.$^7$ ............................................... H01R 12/00
(52) U.S. Cl. ........................................... 439/83; 29/739
(58) Field of Search .......................... 439/83, 876, 885, 439/78, 81–82; 29/730, 842–845, 740, 741; 228/246, 56.3, 180.1, 255

(56) References Cited

U.S. PATENT DOCUMENTS

| | | | |
|---|---|---|---|
| 4,420,877 A | | 12/1983 | McKenzie, Jr. .............. 29/739 |
| 5,046,971 A | * | 9/1991 | Ruggiero et al. ........... 439/741 |
| 5,059,130 A | * | 10/1991 | Miller, Jr. .................... 439/74 |
| 5,176,254 A | * | 1/1993 | Caravona ..................... 206/728 |
| 6,179,631 B1 | | 1/2001 | Downes et al. ............... 439/83 |
| 2002/0016096 A1 | | 2/2002 | Custer et al. ................. 439/83 |

* cited by examiner

Primary Examiner—J. F. Duverne
(74) Attorney, Agent, or Firm—Mayer Fortkort & Williams, PC; Karin L. Williams Esq.

(57) ABSTRACT

A method for providing a mechanical/electrical interconnection between two circuit boards, and the interconnection components required therefore, include a pin and socket each having a tail portion, a shoulder portion and a head portion. The tail portion of the pin is sized so as to fit into a plated through hole of the first board, the head portion is sized so as to allow an automated device to capture the head portion and to rest on top of the plated through hole when inserted therein, and the shoulder portion is sized in relation to the plated through hole so as to rest inside the plated through hole and to allow a predetermined amount of solder to flow under the head portion and down into the plated through hole, but not as far down as the tail portion, thereby assisting in centering the pin in the through hole. Upon heating to a solder reflow temperature, a ring of solder, around the periphery of the head portion of the pin and the shoulder portion of the socket, flows under the head of the pin and the shoulder of the socket, thereby forming a soldered electrical connection between the pin and the first board, and the socket and the second board. By aligning the pin with the socket and inserting the tail portion of the pin into the cavity of the socket, a separable reliable mechanical and electrical interconnection is formed between the first board and the second board.

17 Claims, 6 Drawing Sheets

INTERCONNECTION PIN/SOCKET COMPONENTS FOR ELECTRICALLY CONNECTING TWO CIRCUIT BOARDS AND METHOD FOR MOUNTING SAID COMPONENTS IN A CIRCUIT BOARD

STATEMENT OF RELATED APPLICATIONS

This application claims the benefit of priority to U.S. Provisional Patent Application Ser. No. 60/365,824, filed on Mar. 20, 2002, entitled "Pin/Socket Components Designed For Mounting To A Surface Mount Circuit Board and Method For Mounting Said Components."

FIELD OF THE INVENTION

The present invention relates generally to a method, and to the pin and socket interconnection components required, for mounting and electrically connecting a module to a surface mount technology circuit board.

BACKGROUND OF THE INVENTION

Pin and socket interconnection technology exists in the industry today. The prevalent method in which a pin and socket are attached to a surface mount technology circuit board, to create the attachment in a high capacity production environment, is by press-fitting the pin and socket into their respective circuit boards then reflowing solder paste that was pre-deposited around the interconnection components on the board. However, this requires specialized and expensive through-hole insertion capital equipment to be purchased and placed within the surface mount reflow manufacturing line. The equipment can be as costly as $200,000 per surface mount reflow line. It would also be necessary to run multiple reflow manufacturing lines to handle a normally diverse product line.

In addition, besides incurring significant capital expenditures to incorporate the press-fit pin and socket approach within a factory, this technology is also very limited in its application. The type of circuit board dielectric material and its thickness play an important role in determining if press-fit technology may be utilized. Amplifier designs utilize microwave board materials, which are often fabricated from PTFE materials. This material is Teflon-based and is soft in nature. This softness makes press fitting interconnecting components difficult. Further, the plated-through holes in such materials are less precise than in rigid materials, often resulting in an unreliable connection between the interconnecting component and board. Finally, the board dielectric material often needs to be thin to provide the optimum width transmission lines. These two constraints render the "press-fit approach" unacceptable in many applications, for example, in applications requiring a highly reliable RF connection between amplifier modules and motherboards of power amplifiers used in wireless base stations.

Thus, the present invention is therefore directed to the problem of developing a method of mounting interconnection pin and socket components in printed circuit boards, that method providing the capability of using a standard surface mount reflow manufacturing line, thereby providing a significant amount of flexibility.

It is a further object of the present invention to provide pin and socket interconnection components that may be easily designed into any circuit board and seamlessly incorporated into a standard surface mount reflow manufacturing line. These through-hole interconnection components should be designed and packaged such that they can be assembled to a circuit board with standard surface mount pick and place equipment, which includes the use of standard vacuum nozzles within the pick and place equipment. Finally, the components should allow normal fabrication and assembly variations to be utilized in all aspects of the process.

SUMMARY OF THE INVENTION

The present invention solves these and other problems by providing interconnection components including a pin and socket, each having a head diameter that is wide enough such that a standard vacuum nozzle can capture it. The pin tail has two diameters—a smaller diameter for the tail and a slightly larger diameter for the shoulder which is just under the head. The upper or "shoulder" portion of the tail, adjacent to the head, is sized so that it assists in centering the pin within the plated through hole of a surface of a circuit board. Similarly, the socket has two diameters below the head: the lowermost smaller "tail" diameter, and a larger diameter referred to herein as the "shoulder".

Solder paste, pre-deposited on the circuit board, sits around the periphery of the pin head and the periphery of the socket shoulder upon insertion of the pin and socket into each respective circuit board. When the circuit board is brought up to solder reflow temperatures, the solder flows under the head portion of the pin and the shoulder portion of the socket, and down the plated through hole to provide a mechanical and electrical connection. This reflow process also acts to center the pin/socket within the plated through hole, which aids in reducing tolerances in the pin and socket alignment effort. The diameter of the plated through hole, the diameters of the pin head and pin shoulder, and a precise amount of solder paste, together allow all of the solder to reside in the plated through hole and around the head of the pin.

In one illustrative embodiment of the invention, a pin/surface mount printed circuit board assembly, for providing an electrical connection between a surface mount printed circuit board and a surface mount motherboard, includes a surface mount circuit board having at least one through hole with a diameter and a pin comprising a tail portion, a shoulder portion and a head portion, the tail portion and the shoulder portion having a diameter that is less than the diameter of the at least one through hole, and the head portion having a diameter that is greater than the diameter of the through hole. The diameter of the shoulder portion is such, in relation to the diameter of the through hole, so as to rest inside the through hole and to allow solder to flow under the head portion and down into the through hole, but not as far down as the tail portion, thereby forming a solder joint between the pin and the through hole and assisting in centering the pin in the through hole. An electrical connection between the surface mount printed circuit board and a surface mount motherboard is provided by inserting the tail portion of the pin into a corresponding socket of the surface mount motherboard.

In yet a further embodiment, the solder is provided in a solder mask dam that is supported on the surface mount printed circuit board. And in yet a further embodiment, a preform solder paste is supported on the surface mount printed circuit board.

In a further illustrative embodiment of the invention, a method is provided for mounting an interconnect component into a plated through hole of a printed circuit board, the component having a head portion, shoulder portion and a tail portion, each of the shoulder and tail portions having a diameter that is less than the diameter of the plated through hole and the head portion having a diameter that is greater than the diameter of the plated through hole. The head portion of the interconnect component is captured, the tail portion of the interconnect component is positioned over the plated through hole and is inserted into the through hole and the circuit board is heated to a prespecified solder reflow temperature such that solder around the periphery of the through hole flows under the head portion of the interconnect component and down into the through hole so as to form a solder joint between the pin and the plated through hole. The diameter and length of the shoulder portion, the diameter of the head portion, a diameter of the through hole and a prespecified amount of solder paste, are such so as to prevent the solder from flowing to the tail portion.

In yet a further embodiment of the invention, a separable mechanical and electrical interconnection is provided between a first board and a second board. The interconnection includes a pin having a tail portion sized so as to fit into a plated through hole of the first board, a head portion sized to have a diameter greater than a diameter of the through hole and to rest on top of the plated through hole when inserted therein, and a shoulder portion sized in relation to the plated through hole so as to rest inside the plated through hole and to allow solder to flow under the head portion and down into the plated through hole, but not as far down as the tail portion, thereby assisting in centering the pin in the through hole. The interconnection also includes a socket having a cavity, a tail portion sized so as to fit into a plated through hole of the second board, and a shoulder portion sized in relation to the plated through hole so as to rest on top of the through hole and to allow solder to flow under the shoulder portion and down into the plated through hole, thereby assisting in centering the socket in the through hole. Upon heating, solder, around the periphery of the head portion of the pin and the shoulder portion of the socket, flows under the head of the pin and the shoulder of the socket, thereby forming a soldered electrical connection between the pin and the first board, and between the socket and the second board, respectively. The pin and socket are joined by aligning and inserting the tail portion of the pin into the cavity of the socket, thereby forming a separable mechanical and electrical interconnection between the first board and the second board.

The proposed interconnect components and method provide the capability of quickly and reliably interconnecting thin RF circuit boards with a mounting process that provides structural integrity, allows for modular designs within amplifiers, provides ease of assembly and repair, and provides the necessary float within each individual mated pair such that gang interconnections are possible while withstanding the normal variation seen in standard manufacturing processes.

BRIEF DESCRIPTION OF THE DRAWINGS

The foregoing and other objects and advantages of the present invention will become apparent with reference to the following detailed description when taken in conjunction with the accompanying drawings, in which.

DETAILED DESCRIPTION

It is worthy to note that any reference herein to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
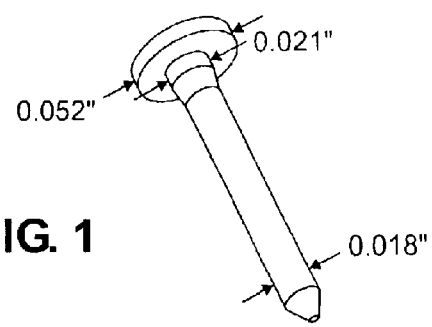
FIG. 1 is a side view of a pin according to a preferred embodiment of the present invention.

FIG. 1 illustrates a preferred embodiment of a surface mount pin designed in accordance with the present invention to be interconnected with a surface mount socket (described in detail below). While the pin may of course be manually inserted into a plated-through hole, extending through the circuit board, those skilled in the art will appreciate that it is also capable of being automatically mounted into the board using standard automated pick and place equipment, which may utilize user-friendly tape-and-reel packaging to even further improve the efficiency of the automated assembly process.

As shown in FIG. 1, the tip of surface mount pin 10 is nail shaped, which enhances the ability to insert the tip into a plated-through hole of a circuit board, but a tail of a pin in accordance with the teachings herein may of course be of any other shape to facilitate insertion, such as a hemispherical tip, if desired. The head of pin 10 is shown to have an illustrative head diameter of 0.052 inches (of course the diameter of the head, tail or shoulder of the pin, and any other specific measurements provided herein, are provided only for illustrative purposes and are not meant to limit the scope of the invention in any way). The width of the head is wide enough such that a standard vacuum nozzle of the automated assembly process can capture it. The nozzle holds the pin with the tail pointing down toward the circuit board into which the pin will be installed. The diameter of the tail portion of the pin is 0.018-inch and possesses a lead-in chamfer.

Figure 2:
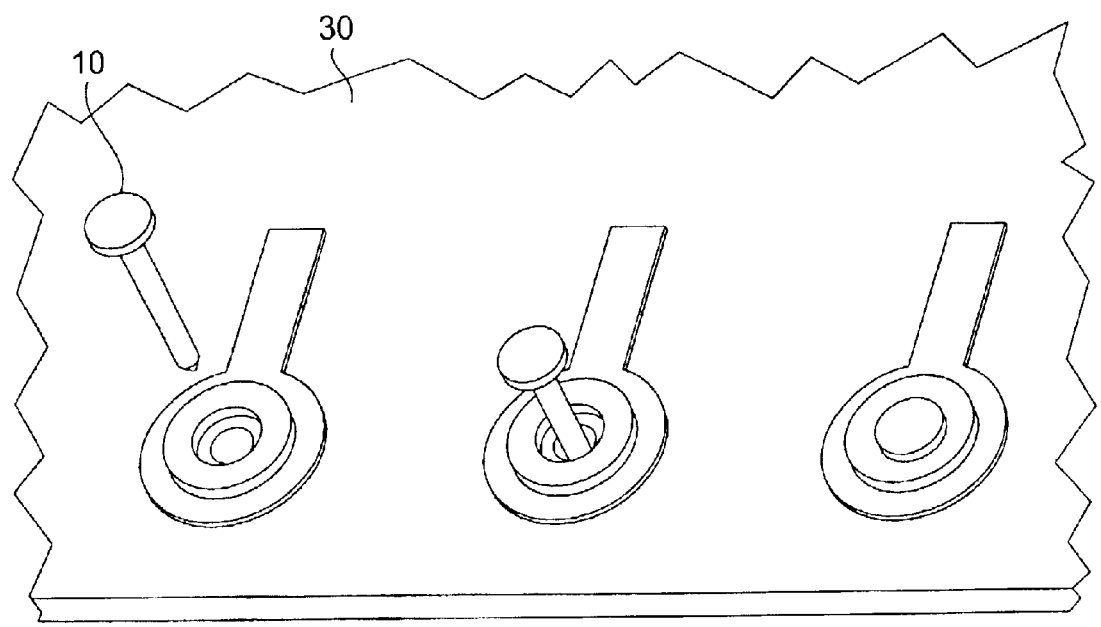
FIGS. 2–3 are top and bottom views, respectively, of the pin of FIG. 1 being inserted into a plated-through-hole of a printed circuit board.
Figure 3:
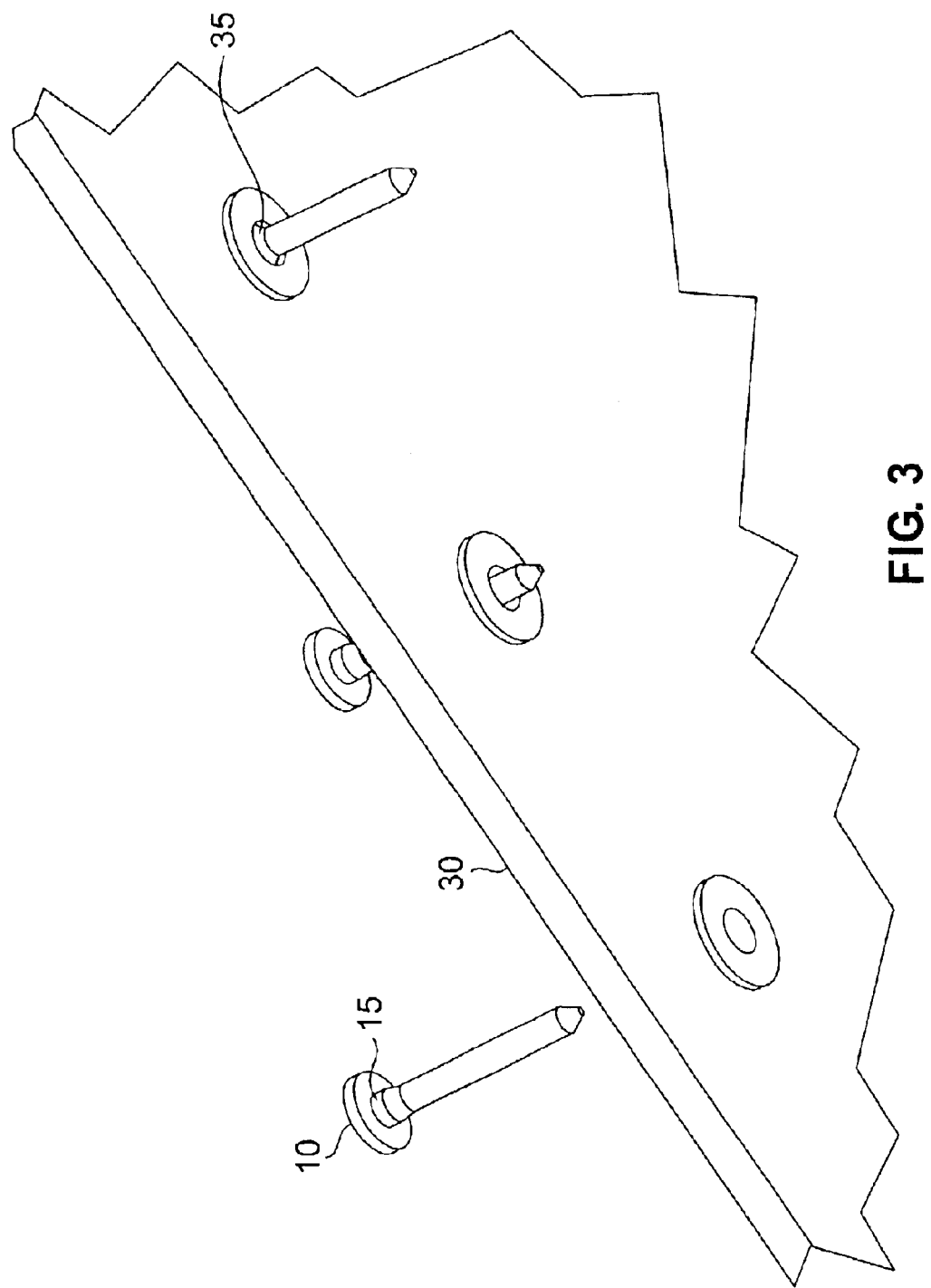

As illustrated in FIGS. 2–3, the nozzle positions the pin 10 so that the tail passes through a 0.025-inch diameter plated through hole (again, the actual measurements are only exemplary) in the circuit board 30 and the underside of the head rests on the surface of the circuit board (upon which a solder paste, or solder "preform" as illustrated, has been previously deposited). The diameter of the plated through hole allows enough clearance between the tail of the pin 10 and the through hole of the circuit board to allow a tolerance needed for a standard surface mount machine to insert the through-hole pin 10 into the circuit board 30. The upper or "shoulder" portion 15 of the tail, adjacent to the head, is illustratively shouldered to 0.021-inch, which assists in centering the pin 10 within the 0.025-inch diameter plated through hole.

Utilizing the standard stencil print process, a ring of solder paste is pre-deposited so as to be located around the periphery of the pin head upon insertion into the circuit board to solder pin 10 to circuit board 30 and provide an electrical contact thereto (those skilled in the art will appreciate that the solder may be solder "preform", or that the solder paste may not be deposited in a "complete ring" but rather may be deposited in any formation, including as a plurality of sectors in a ring formation). Of course either the entire circuit board, or only the individual pin itself, may be heated to the predetermined solder reflow temperature sufficient to melt the solder paste. Once the circuit board 30 is heated to the solder reflow temperature, the solder will flow under the head portion of the pin 10 and down the plated through hole to substantially fill the plated through hole and to form a solder joint 35, thereby providing a mechanical and electrical connection.

Those skilled in the art will appreciate that the industry-standard process for pin-in-paste reflow is to deposit solder paste atop the through hole prior to insertion of the through-hole component. However, solder paste located atop the hole will naturally result in solder residue on the pin, which is unacceptable for an electrical interconnect surface.

Extensive assembly processes development by Applicants have yielded a successful process of depositing solder paste adjacent to (but not atop) the through hole and yet in a close proximity such that the head of the pin makes contact with the solder paste. This same solder paste deposit is also applied atop a carefully dimensioned ring of solder mask (not shown) that surrounds the through hole location. The paste deposits flow toward the pin and hole during oven reflow and contacts the perimeter of the pin head, equalizing the capillary forces during reflow and thus ensuring a soldered pin that is straight and ready for proper insertion to the mating socket. Specifically, the capillary action of the solder paste during reflow draws the pin down into proper position over the solder pad of the through hole of the circuit board. The reflow completes the required solder joint, resulting in the efficient utilization of all solder paste volume for the pin head and hole while at the same time preventing foreign material from contaminating the interconnect portion (tail) of the pin. Because the paste is not applied atop the hole, the use of a nitrogen environment is preferred during the oven reflow process at a recommended 100 ppm ((or less) of oxygen) to help ensure the consistent flow of solder to the full extent of the pin hole.

In acting to center the pin 10 within the plated through hole, the reflow process aids in reducing tolerances in the pin and socket alignment effort. A precise amount of solder paste is predetermined such that all of the solder resides in the plated through hole and around the head/shoulder of the pin 10 and does not flow down the tail of the pin. Specifically, the amount of solder required to form a reliable solder joint and yet ensure that the solder does not extend beyond the plated through hole, is a function of the diameter of the plated through hole, the diameters of the pin head, pin shoulder, and pin tail, and the diameters of the socket head, socket shoulder and socket tail. Those skilled in the art will appreciate that solder on the interface portion of the pin tail would render the electrical interconnection unreliable.

Figure 4:
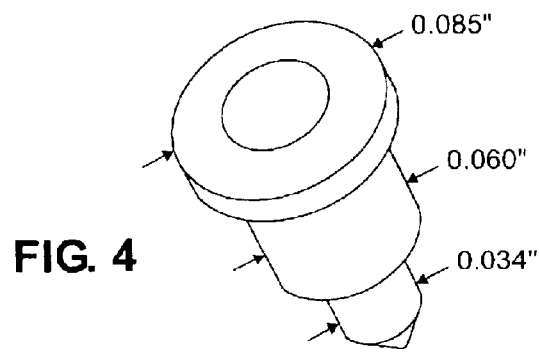
FIG. 4 is a side view of a socket according to a preferred embodiment of the present invention.

While many of the details discussed above with regard to pin 10 are also applicable to the preferred embodiment of a surface mount socket in accordance with the present invention, the details of the socket 50 are illustrated in FIG. 4. Similar to the pin 10, the socket 50 is configured so as to enable the through-hole socket to be picked up by a standard surface mount pick and place vacuum nozzle by its 0.085-inch diameter head (again, the diameter of the head, tail or shoulder of the socket, and any other specific measurements provided herein, are provided only for illustrative purposes and is not meant to limit the scope of the invention in any way). The socket internal cavity is blind therefore allowing the nozzle to maintain suction.

Figure 5:
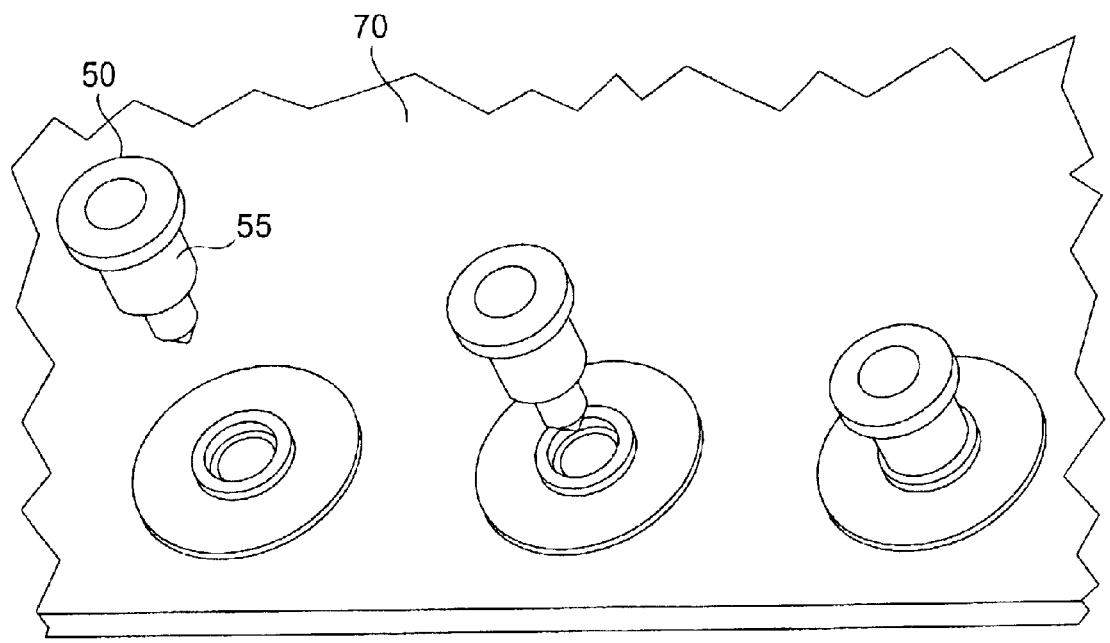
FIGS. 5–6 are top and bottom views, respectively, of the socket of FIG. 4 being inserted into a plated-through-hole of a printed circuit board.
Figure 6:
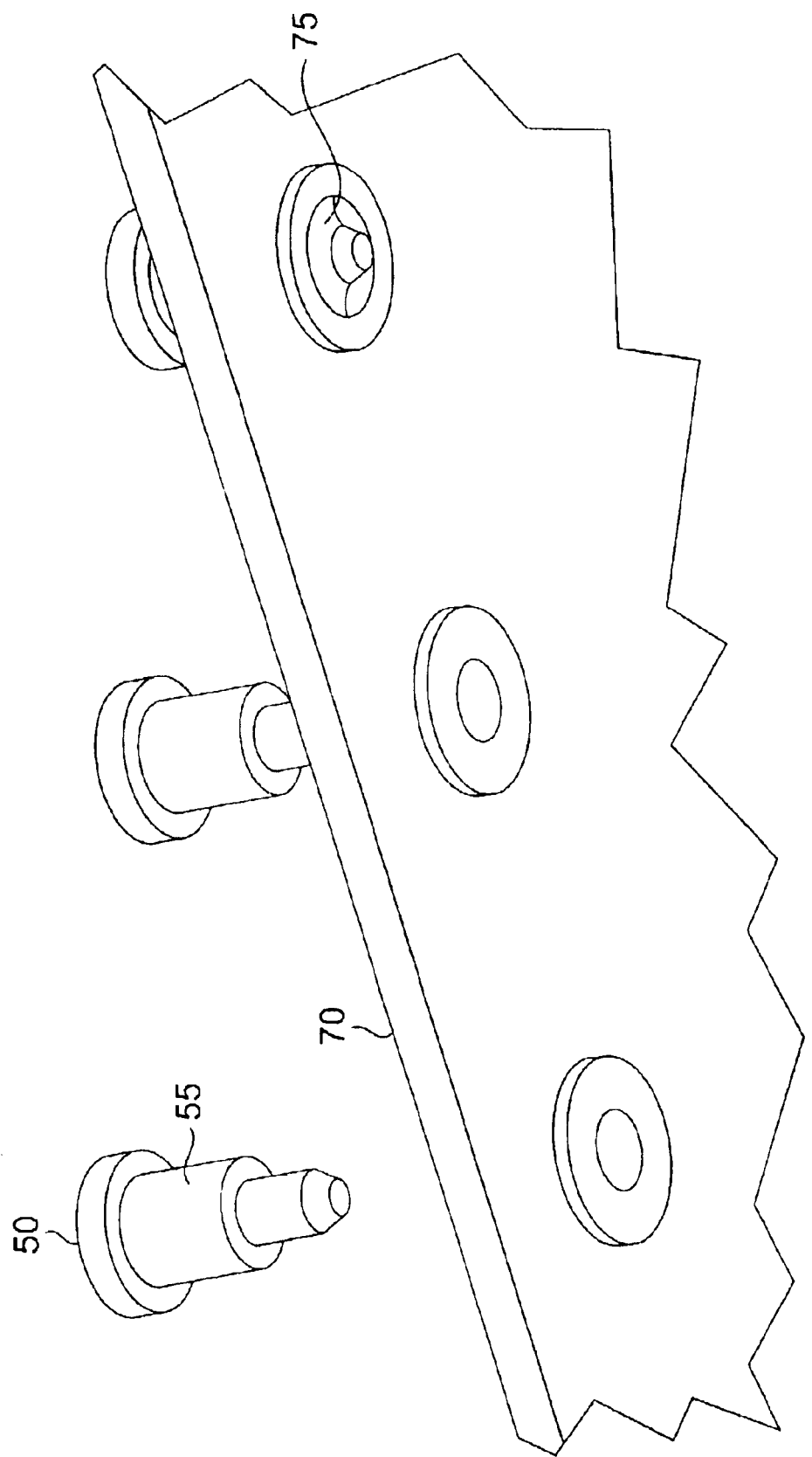

Again, similar to FIGS. 2–3 in reference to the pin, as shown in FIGS. 5–6, the tail of socket 50 is pointing down toward the circuit board 70 and is placed into a 0.040-inch diameter plated through hole. The socket 50 then rests on the 0.060-inch diameter shoulder 55 and is then solder reflowed attached, similar to the pin 10, with all of the same characteristics and benefits.

Figure 7:
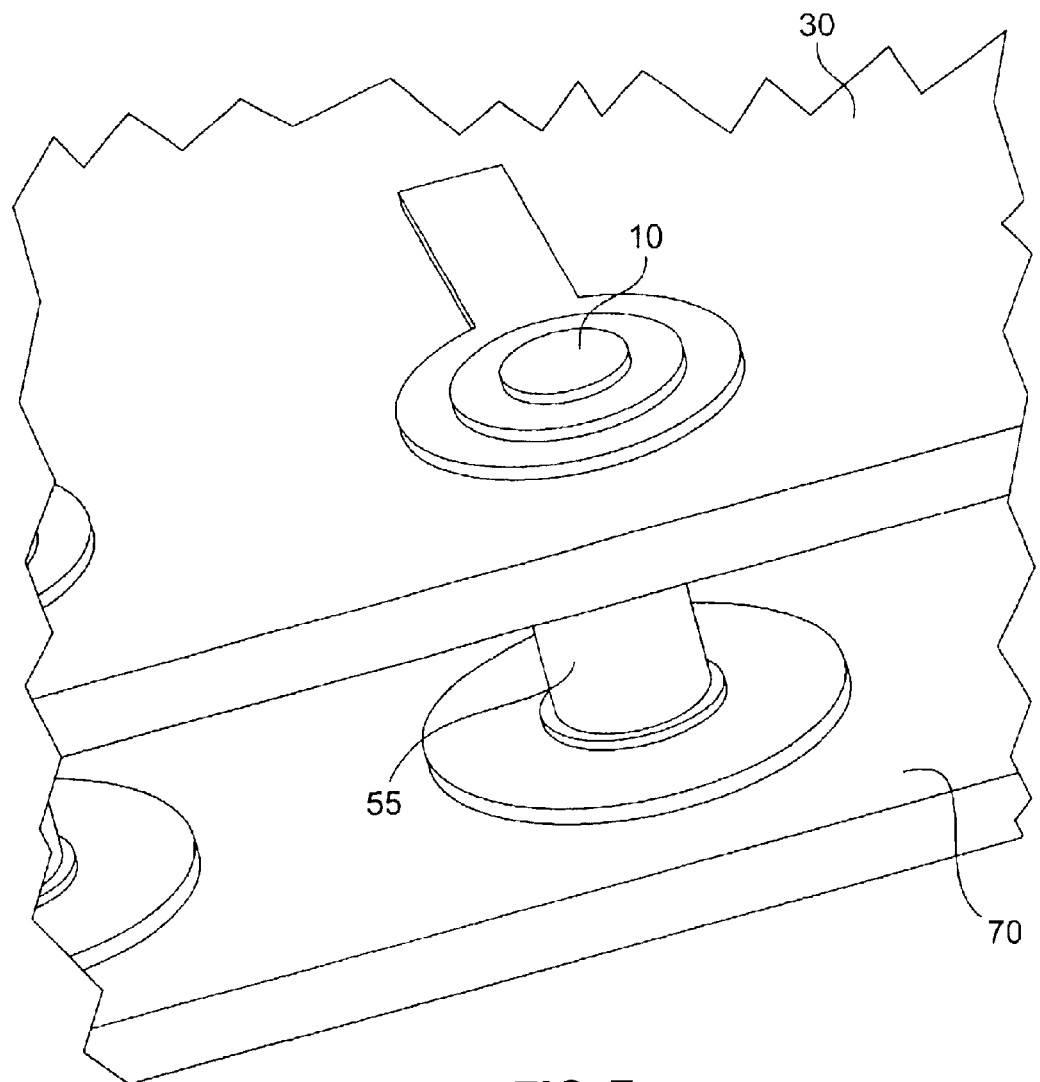
FIGS. 7–8 are top/side and side/bottom views, respectively, of the pin of FIG. 1 and the socket of FIG. 4, each supported in its corresponding printed circuit board and the pin mounted within the socket.
Figure 8:
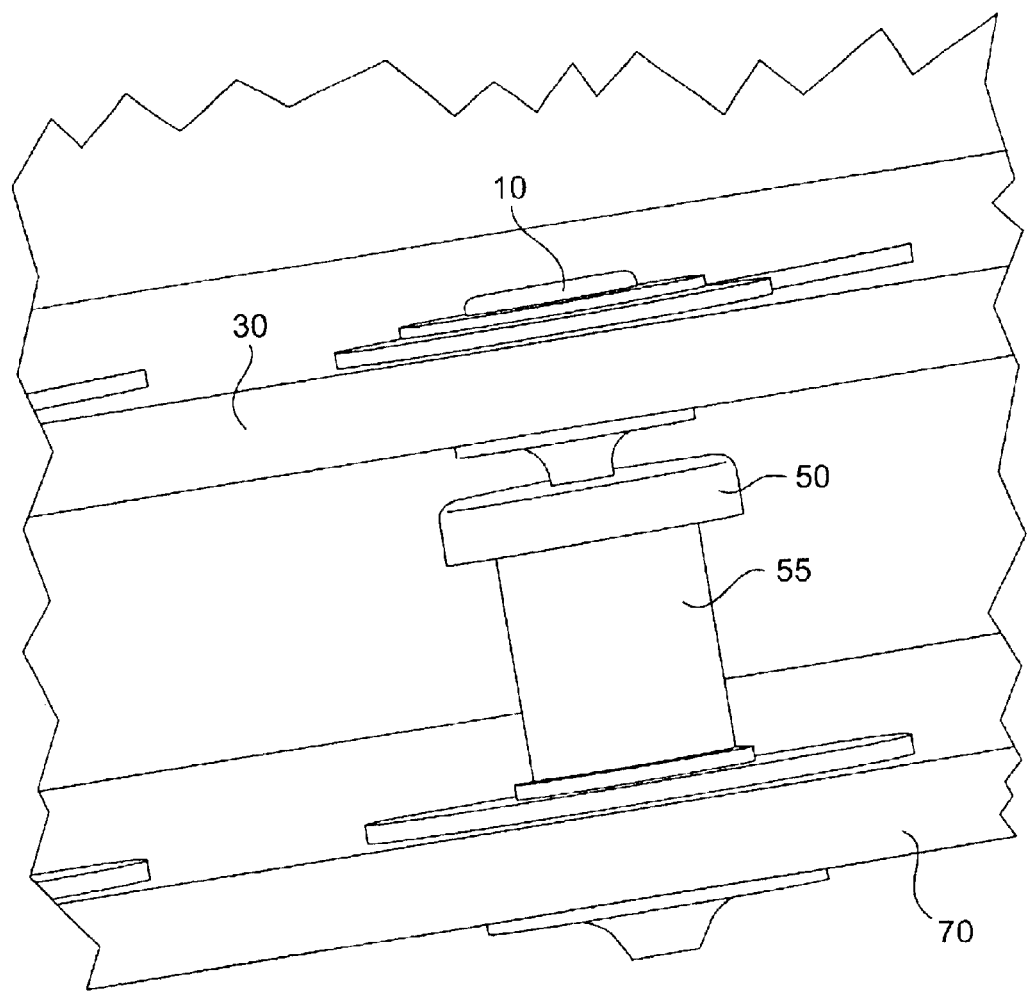

After each is mounted into its respective circuit board, the pin and socket may be joined as illustrated in FIGS. 7–8, so as to form an interconnection, by aligning the pin with the socket and inserting the tail portion of the pin 10 into the cavity of the socket 50.

Returning to FIG. 1, it is essential that the dimensions of the pin 10 is such that when mounted into the circuit board 30, the solder paste will flow under the head of the pin and down into the through hole alongside the shoulder of the pin, but will not flow as far as the tail of pin 10. This enables the solder to, together with the shoulder, assist in recentering the pin 10 into the through hole while avoiding any problems that may arise from allowing the solder to flow to the tail.

The specific configuration/measurements of the pin and socket to be incorporated into circuit board designs are critical to the RF performance of the interconnection, the mechanical integrity of the solder joint and the manufacturability of the entire interconnection system. The exemplary pin and socket measurements noted throughout the detailed description herein are such to allow for a misalignment of 0.008 inches radially. This has been accomplished by maximizing the internal diameter of the socket, and providing a compliant spring member inside the socket, while maintaining a reliable interconnect and minimizing the diameter of the pin to enhance its compliant nature. Of course various pin and plated through hole diameters may be implemented according to any particular requirements, and would be supported by the broad teachings herein.

Specifically, the interconnection pin and socket components, and the method of mounting those components into a circuit board, according to the preferred embodiment described herein, allow for the use of automated equipment to mount the components into respective circuit boards, to create a reliable electrical/mechanical solder joint by heating an appropriate amount of solder to the necessary solder reflow temperature, and to provide a reliable electrical connection between the two surface mount circuit boards by mounting the tip of the pin into the cavity of the socket.

Although various embodiments are specifically illustrated and described herein, it will be appreciated that modifications and variations of the invention are covered by the above teachings and are within the purview of the appended claims without departing from the spirit and intended scope of the invention. Furthermore, these examples should not be interpreted to limit the modifications and variations of the invention covered by the claims but are merely illustrative of possible variations.

What is claimed is:

1. A pin/surface mount printed circuit board assembly, for providing an electrical connection between a surface mount printed circuit board and a surface mount motherboard, the pin/surface mount circuit board assembly comprising:

a surface mount circuit board having at least one through hole with a diameter; and a pin comprising a tail portion, a shoulder portion and a head portion, the tail portion and the shoulder portion having a diameter that is less than the diameter of the at least one through hole, and the head portion having a diameter that is greater than the diameter of the through hole, wherein the diameter of the shoulder portion is such, in relation to the diameter of the through hole, so as to rest inside the through hole and to allow solder to flow under the head portion and down into the through hole, but not as far down as the tail portion, thereby forming a solder joint between the pin and the through hole and assisting in centering the pin in the through hole, and further wherein an electrical connection between the surface mount printed circuit board and a surface mount motherboard is provided by inserting the tail portion of the pin into a corresponding socket of the surface mount motherboard.

2. The pin/surface mount printed circuit board assembly recited in claim 1, wherein the solder is provided in a solder mask dam that is supported on the surface mount printed circuit board.

3. The pin/surface mount printed circuit board assembly recited in claim 2, wherein the solder comprises a preform solder supported on the surface mount printed circuit board.

4. The pin/surface mount printed circuit board assembly recited in claim 2, wherein the solder comprises solder paste deposited in a ring formation onto the solder mask dam.

5. The pin/surface mount printed circuit board assembly recited in claim 2, wherein the diameter of the head portion is such to allow an automated device to capture the head portion.

6. A method of mounting an interconnect component into a plated through hole, with a diameter, of a printed circuit board, the component having a head portion, shoulder portion and a tail portion, each of the shoulder and tail portions having a diameter that is less than the diameter of the plated through hole and the head portion having a diameter that is greater than the diameter of the plated through hole, the method comprising the steps of:

capturing the head portion of the interconnect component;

positioning the tail portion of the interconnect component over the plated through hole;

inserting the tail portion of the interconnect component into the through hole; and heating the circuit board to a prespecified solder reflow temperature;

wherein said heating step causes solder around the periphery of the through hole to flow under the head portion of the interconnect component and down into the through hole so as to form a solder joint between the pin and the plated through hole, and further wherein the diameter and length of the shoulder portion, the diameter of the head portion, a diameter of the through hole and a prespecified amount of solder paste, are such so as to prevent the solder from flowing to the tail portion.

7. The method of claim 6 wherein said capturing step, said positioning step and said inserting step are each manually performed.

8. The method of claim 6 wherein said capturing step, said positioning step and said inserting step are each performed by an automated device.

9. The method of claim 6 wherein said heating step comprises locally heating the solder.

10. The method of claim 6 wherein said heating step comprises heating the entire printed circuit board.

11. The method of claim 6 further comprising the step of depositing solder paste, having the prespecified solder reflow temperature, adjacent to the plated through hole and atop a solder mask ring that surrounds the plated through hole.

12. The method of claim 11 wherein said depositing step occurs prior to said capturing step.

13. The method of claim 6 further comprising the step of depositing a preform solder onto the printed circuit board, the solder preform surrounding the plated through hole.

14. The method of claim 13 wherein the solder preform has a ring formation.

15. The method of claim 8 wherein the automated device interacts with a tape and reel in which the interconnection component is placed.

16. A separable mechanical and electrical interconnection between a first board and a second board, said interconnection comprising:

a pin having a tail portion, a shoulder portion and a head portion, said pin having the tail portion sized so as to fit into a plated through hole of the first board, the head portion sized to have a diameter greater than a diameter of the plated through hole and to rest on top of the plated through hole when inserted therein, and the shoulder portion sized in relation to the plated through hole so as to rest inside the plated through hole and to allow solder to flow under the head portion and down into the plated through hole, but not as far down as the tail portion, thereby assisting in centering the pin in the through hole; and a socket having a tail portion, a shoulder portion, a head portion and a cavity defined therein, said socket having the tail portion sized so as to fit into a plated through hole of the second board and the shoulder portion sized in relation to the plated through hole so as to rest on top of the through hole and to allow solder to flow under the shoulder portion and down into the plated through hole, thereby assisting in centering the socket in the through hole;

wherein upon heating, a ring of solder, around the periphery of the head portion of said pin and the shoulder portion of said socket, flows under the head of the pin and the shoulder of the socket, thereby forming a soldered electrical connection between said pin and the first board, and between said socket and the second board, respectively, and wherein said pin and said socket are joined, by aligning said pin with said socket and inserting the tail portion of said pin into the cavity of said socket, thereby forming a separable mechanical and electrical interconnection between the first board and the second board.

17. The interconnection of claim 16, wherein the first board comprises a module and the second board comprises a motherboard.

* * * * *